March 19, 1968 W. B. GAUNT, JR 3,374,445
LOW DISTORTION OSCILLATOR USING DUAL FEEDBACK
PATHS AND SYMMETRICAL CLIPPING
Filed April 28, 1966
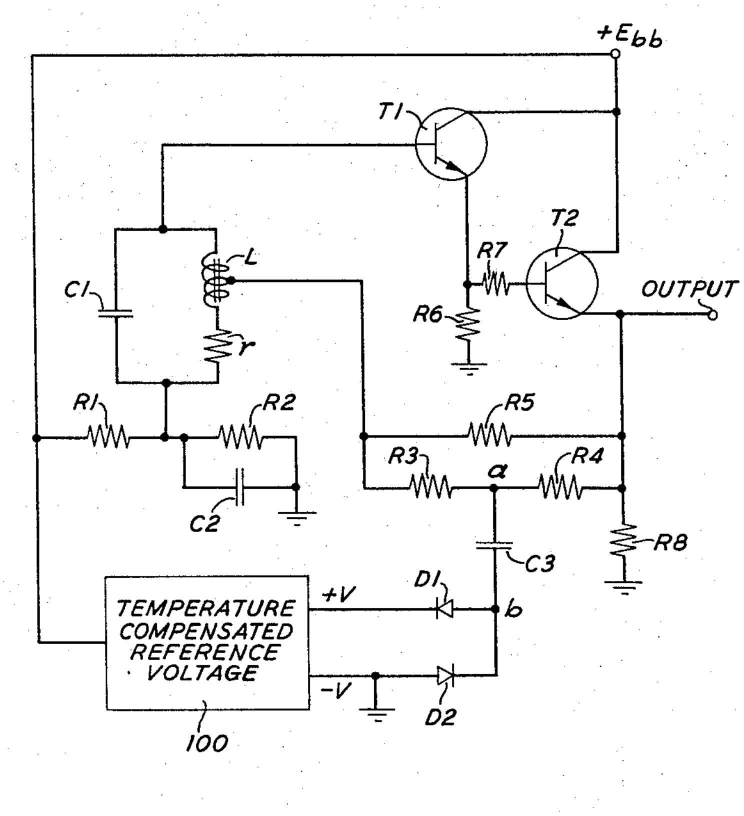
INVENTOR
W. B. GAUNT, JR.
BY
C. E. Hirsch Jr.
ATTORNEY United States Patent Office 3,374,445
Patented Mar. 19, 1968

3,374,445

LOW DISTORTION OSCILLATOR USING DUAL FEEDBACK PATHS AND SYMMETRICAL CLIPPING

Wilmer B. Gaunt, Jr., New Shrewsbury, N.J., assignor to Bell Telephone Laboratories, Incorporated, New York, N.Y., a corporation of New York Filed Apr. 28, 1966, Ser. No. 545,911
10 Claims. (Cl. 331—109)

ABSTRACT OF THE DISCLOSURE

An oscillator is disclosed which achieves low harmonic distortion and improved amplitude and frequency stability by use of two positive-feedback paths and a symmetrical clipping network carefully connected to a selected point on one of the feedback paths.

This invention relates to oscillators and in particular to oscillators which produce output signals with low harmonic distortion. It is an object of this invention to reduce the harmonic distortion in the output signal developed by an oscillator and at the same time to increase its amplitude and frequency stability.

Prior art oscillators capable of producing undistorted output signals with good amplitude and frequency stability tend to use complex, bulky and expensive filtering networks to remove or reduce distortion products produced, for example, by amplitude limiting networks. Because limiting networks are often placed across the output leads of such an oscillator, the resulting distortion tends to be quite high, and such oscillators achieve low harmonic distortion at the price of increased component weight and cost.

This invention, on the other hand, improves the operation of an oscillator and enables a compact, inexpensive oscillator to be constructed which can produce an output signal with negligible distortion and with extremely good amplitude and frequency stability. The principles of the invention are especially useful in relatively low frequency applications, e.g., 300 to 1000 cycles per second, employed to yield a relatively high signal output, on the order of several volts. According to this invention, such oscillator performance is achieved by utilizing two separate positive-feedback paths together with a clipping or "limiting" circuit connected by a bias capacitor to a carefully selected point on one of the two feedback paths. By placing the clipping circuit at a carefully selected point on one of the feedback paths, rather than across the tuned tank circuit or at the output lead of the oscillator amplifier, loading on the tank circuit during the amplitude limiting time is reduced. As a result, a high average effective "Q" for the oscillator circuit is achieved making possible the use of smaller, and usually less expensive components in the tank circuit than heretofore possible. Since the attenuation of harmonics is directly proportional to the effective "Q" of the oscillator circuit, this invention achieves a significant reduction of the harmonic distortion in the output signal from the oscillator.

In addition, excellent amplitude stability is achieved by referencing the clipping circuit to a temperature compensating voltage source. Frequency stability is obtained by using a precision, fixed-tuned, LC tank circuit together with an oscillator amplifier possessing a high input impedance.

This invention may be more fully understood from the following detailed description, taken together with the single drawing which shows an oscillator constructed according to the principles of this invention.

In the drawing, a precision-tuned tank circuit, consisting of capacitor C1 and center-tapped iron-cored inductor L (with series loss $r$), is connected to the input lead of a high-gain amplifier. The high-gain amplifier may comprise two series-connected transistors T1 and T2, arranged in the grounded collector configuration. While the amplifier is shown utilizing NPN transistors, other amplifiers utilizing PNP transistors or vacuum tubes can of course be employed. In the configuration shown, the tank circuit is connected to the base electrode of T1. The emitter electrode of T1 is connected through coupling impedance R7, shown as a resistor, to the base of T2, and is forward biased by resistor R6 connected from emitter to ground. The collector electrodes of both transistors are connected to a source of positive bias voltage $E_{bb}$, and the emitter electrode of T2 serves as the output lead of the amplifier. A current proportional to the voltage across load resistor R8 is fed back to the center tap on inductor L by means of two positive-feedback paths.

The first positive-feedback path comprises series-connected resistors R3 and R4. According to this invention, a limiting or clipping circuit is connected at a selected point between these two resistors by means of a coupling capacitor C3. The clipping circuit consists of two oppositely-poled diodes, D1 and D2. Diode D1 is referenced to a positive reference voltage V from source 100, and therefore is arranged to clip the positive alternating current peaks at point $a$. Diode D2 is arranged to clip negative alternating current voltage peaks. Reference voltage source 100 provides a compensatory control voltage to ensure amplitude stability of the oscillator output signal over a wide environmental temperature range. Such a temperature-compensating reference voltage unit is well known in the art and thus will not be described in detail.

Capacitor C3 charges to an average voltage at point $b$ with respect to ground of $+V/2$. Thus diode D1 clips positive alternating current voltages at point $a$ which are greater than $+V/2$ plus the junction potential of D1, while diode D2, referenced to ground, clips negative alternating current voltages at point $a$ which are less than $-V/2$ plus the junction potential of D2. Resistor R3 prevents diodes D1 and D2 from shunting the tank circuit with a short circuit, and thus prevents the "Q" of the oscillator circuit from dropping to zero during clipping. Similarly, resistor R4 prevents the diodes from shorting the output lead during clipping and thus prevents the diodes from shorting the tank circuit through the amplifier during clipping. As a result, the tank circuit continues to attenuate or filter the harmonics produced by the clipping even during the clipping operation.

To further increase the effective "Q" of the oscillator circuit, it is in accordance with the invention to provide a second positive-feedback path containing resistor R5. This feedback path is so proportioned that the feedback amplifier is approximately at the point of oscillation when the feedback path associated with the clipping circuit is open-circuited. This effectively increases the circuit "Q." Because of this, resistors R3 and R4 in the first feedback path are selected to guarantee oscillation for a worst possible combination of component tolerances and also to minimize loading on the tank circuit during clipping. As a result, there is a further reduction in the effect of the clipping on the effective "Q" of the oscillator circuit.

In accordance with this invention the clipping circuit consisting of capacitor C3 and identical diodes D1 and D2 provides symmetrical clipping. That is, the positive and negative signal voltage peaks at point $a$ are identically clipped. Thus even-order harmonics are negligible. Further, because the average "Q" of the oscillator circuit remains high over each oscillation cycle, the odd harmonic components are attenuated more than for an equivalently driven oscillator circuit with the same amount of feedback in a single feedback path. For example, the third harmonic, which is about 10 decibels down from the fundamental, is attenuated another 50 decibels by the above described oscillator circuit so that it is approximately 60 decibels down from the fundamental.

The base electrode of transistor T1 is forward biased through inductor L by resistors R1 and R2 connected as a voltage divider between the positive bias voltage $E_{bb}$ and ground. Resistor R2 is shunted by capacitor C2 which appears as a short circuit to the alternating current at the resonant frequency of the oscillator. As known, the frequency of oscillation is, to a first approximation, equal to the resonant frequency of the tank circuit. Because the loading on the tank circuit during clipping is kept small by the second positive feedback path working together with resistors R3 and R4 and the high-gain amplifier, the effective "Q" of the oscillator circuit is higher than is obtained when the output signal from the oscillator amplifier is clipped directly. Thus it is possible to use smaller, lighter, and thus less expensive components in the tank circuit than is possible in prior art oscillators. By using a small, high-precision, fixed-tuned, LC network for the tank circuit in conjunction with the previously described symmetrical clipping circuit and second feedback network, ±0.5 percent long term frequency stability can be achieved together with total harmonic distortion at least 50 decibels below the amplitude of the fundamental.

Other oscillators incorporating the principles of this invention will be obvious to those skilled in the oscillator arts.

What is claimed is:

1. In an oscillator containing an amplifier with an input and an output lead, a tuned circuit connected to said input lead, and a first positive-feedback path connecting said output lead to said tuned circuit, that improvement which comprises
   a clipping circuit connected to a selected point between two impedances on said first feedback path; and
   a second positive-feedback path parallel to said first feedback path.

2. Apparatus as in claim 1 in which said first feedback path comprises two resistors and said clipping circuit is connected to said first feedback path at a point between said two resistors selected to minimize the loading on said tuned circuit during clipping.

3. Apparatus as in claim 1 in which said second feedback path comprises
   a resistor.

4. An oscillator which comprises
   a two-terminal source of bias voltage, one terminal of which is connected to ground;
   an amplifier possessing a first terminal connected to the other terminal of said voltage source, a second terminal connected to ground, an input lead and an output lead;
   a voltage divider connected between the other terminal of said voltage source and ground;
   a tuned LC circuit connected between said input lead and a specified point on said voltage divider;
   a first positive-feedback network connected between said output lead and a selected point on said tuned LC circuit;
   a three-terminal symmetrical limiting circuit connected to a selected point between two impedances on said first feedback network, a reference voltage unit and ground; and
   a second positive-feedback network shunting said first feedback network.

5. Apparatus as in claim 4 in which said amplifier comprises
   a first and a second transistor, each containing a base, emitter, and collector electrode, said collector electrodes together comprising said first terminal, the base electrode of said first transistor comprising said input lead and the emitter electrode of said second transistor comprising said output lead;
   a first resistor connecting the emitter electrode of said first transistor to the base electrode of said second transistor;
   a second resistor connecting the emitter electrode of said first transistor to said second terminal; and
   a third resistor connecting the emitter electrode of said second transistor to said second terminal.

6. Apparatus as in claim 4 in which said voltage divider comprises
   a first resistor connected to said other terminal of said voltage source;
   a second resistor connected between said first resistor and ground; and
   a capacitor shunting said second resistor.

7. Apparatus as in claim 6 in which said tuned LC circuit comprises
   a center-tapped, iron-core inductor connected to the input terminal of said amplifier and to a selected point between said first and second resistors on said voltage divider; and
   a capacitor shunting said inductor.

8. Apparatus as in claim 7 in which said first positive-feedback network comprises
   two series-connected resistors connected between said output lead and said center-tap on said inductor.

9. Apparatus as in claim 8 in which said symmetrical limiting circuit comprises
   a two-terminal capacitor, one terminal of which is connected between said two series-connected resistors on said first feedback network; and
   two diodes, one diode connected in a specified manner between the other terminal of said capacitor and said reference voltage unit and the other diode connected in the opposite manner between said other terminal and ground.

10. Apparatus as in claim 9 in which said second feedback network comprises
   a resistor.

References Cited

UNITED STATES PATENTS

| | | | |
|---|---|---|---|
| 3,039,067 | 6/1962 | Brauner | 331—117 |
| 3,297,963 | 1/1967 | Halsted | 331—117 |

ROY LAKE, *Primary Examiner.*

S. H. GRIMM, *Assistant Examiner.*